Aug. 8, 1961 J. F. TOWLER 2,995,652

SINGLE TRANSISTOR REFLEX CIRCUIT

Filed Sept. 13, 1957

INVENTOR.
JAMES F. TOWLER
BY
Gust & Irish
ATTORNEYS 2,995,652

SINGLE TRANSISTOR REFLEX CIRCUIT

James F. Towler, Indianapolis, Ind., assignor to Industrial Development Engineering Associates Inc., Indianapolis, Ind.

Filed Sept. 13, 1957, Ser. No. 683,732
6 Claims. (Cl. 250—20)

The present invention relates to a single transistor reflex circuit, and more particularly to a single transistor receiver having optimum sensitivity and selectivity characteristics over the standard broadcast band extending from 550 to 1500 kilocycles.

Single tube or transistor circuits are quite common and widely used. Such receivers, however, cannot compare in performance to the multiple tube or transistor circuits for reasons well known in the art. Single transistor circuits wherein maximum sensitivity and selectivity are desired commonly employ regeneration which is controlled in such a manner as to prevent oscillation but to operate at a point on the threshold of oscillation. Such regenerative receivers are deficient in the respect, among others, of being more sensitive or selective at one frequency than another, and in order to maintain such selectivity, it is necessary to provide a regeneration control which is continuously adjustable over the entire tuning range of the receiver. This control is usually a variable capacitor used in addition to the tuning capacitor of the receiver.

It is an object of this invention to provide a single transistor receiver utilizing regeneration for obtaining optimum selectivity over a wide range of frequencies to be received, such receiver not requiring a regeneration control.

It is another object of this invention to provide a single transistor reflex circuit tunable over the broadcast band of 550 to 1500 kilocycles, which includes capacitive and inductive regeneration means effective to provide optimum regenerative characteristics over the entire frequency spectrum.

It is still another object of this invention to provide a single transistor reflex receiver utilizing capacitive means for providing increased selectivity in the high frequency end of the tuning spectrum and inductive means for providing optimum selectivity over the low frequency end of the spectrum, the joint action of the capacitive and inductive means providing optimum regenerative characteristics over the entire tuning band.

Other objects will become apparent as the description proceeds.

In accordance with the present invention there is provided, in combination, a resonant circuit which includes a ferrite antenna, a transistor having base, emitter and collector elements, an inductor inductively coupled to said resonant circuit, the resonant circuit being coupled to the base and emitter elements, respectively, the inductor also being coupled to the base and emitter elements respectively, a coupling capacitor connected between the collector element and the resonant circuit for providing regenerative feedback, a transformer having primary and secondary windings, the primary winding being operatively coupled between the collector and emitter elements, an audio detector and filtering circuit coupled to the secondary winding for providing audio and direct current signals, a coupling network composed of a capacitor and resistor in shunt coupled between said detector and filtering circuit and said base element thereby providing automatic gain control, the transistor amplifying the audio signal, the transformer being situated in close proximity to the ferrite antenna for inducing a signal therein in phase with the signal in the resonant circuit thereby providing low frequency regenerative feedback.

To the accomplishment of the above and related objects, my invention may be embodied in the forms illustrated in the accompanying drawings, attention being called to the fact, however, that the drawings are illustrative only, and that specific change may be made in the specific constructions illustrated and described, so long as the scope of the appended claims is not violated.

Figure 1:
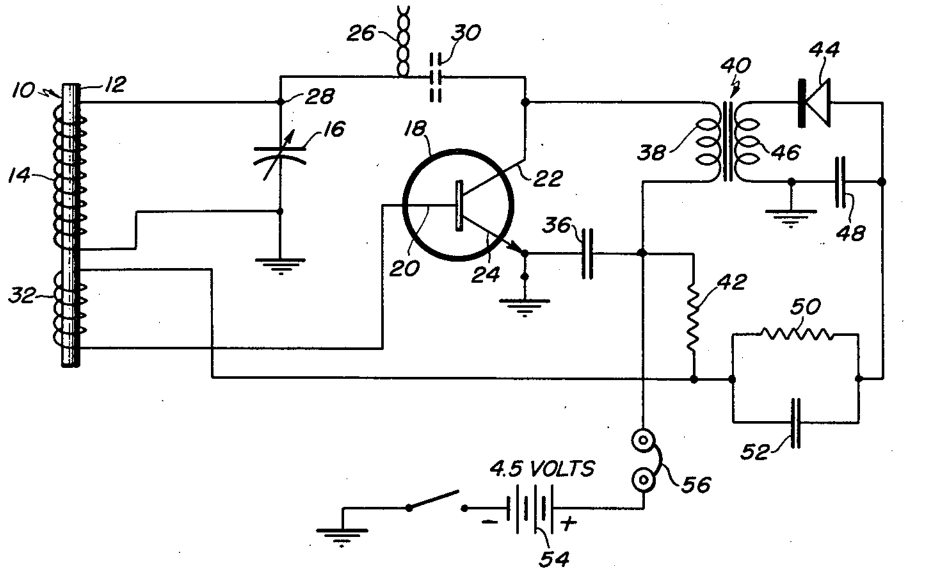
FIG. 1 is a circuit diagram of an embodiment of this invention.

Referring to the drawings, the single transistor reflex circuit of this invention comprises a ferrite antenna 10 composed of the usual ferrite core 12 and inductor 14. A tuning capacitor 16 is coupled across the inductor 14 thereby providing a resonant or tuning circuit operable to select a desired frequency to be received.

Figure 2:
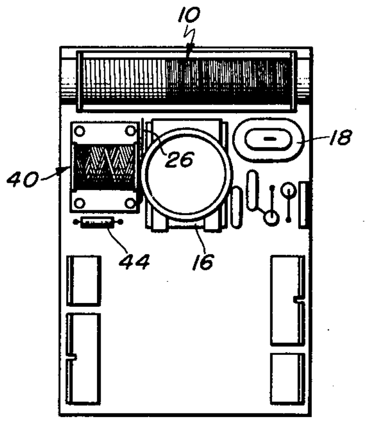
FIG. 2 is a plan view of the receiver of FIG. 1.

A transistor 18 having base, emitter and collector elements 20, 22 and 24, respectively, is coupled to the resonant circuit just described as a regenerative amplifier. The collector 22 is capacitively coupled by means of a low capacity condenser 26 to the upper end 28 of the resonant circuit, this condenser 26 in the illustrated embodiment consisting only of two insulated wires twisted together for a length necessary to provide the necessary capacity. Instead of using these twisted wires as the condenser, a suitable low capacity condenser 30 might be used instead, this condenser being shown in dashed lines and as an alternative to the condenser 26. Such condenser 26 may be a single stiff wire connected to the condenser 16 and extended to just short of the antenna 10 (see FIG. 2).

A winding 32 on the ferrite core 12 is inductively coupled to the inductor 14. The lower end of the winding 32 is connected to the base 20 of the transistor. The emitter is grounded. The primary 38 of coupling transformer 40 is by-passed to ground by means of condenser 36. Biasing resistor 42 is connected between the condenser 36 and the upper end of the winding 32.

The collector 22 of the transistor is connected to the upper end of the transformer winding 38.

A crystal detector or the equivalent 44 is connected in series with the secondary 46 of the transformer 40, a filter capacitor 48 being connected between the detector 44 and ground as shown. Connected to the same side of the detector 44 is a feedback-coupling network composed of a resistor 50 and a capacitor 52, this network being connected also to the upper end of the winding 32.

A source of power indicated as the battery 54 is series-connected with a head set 56 between ground and the transformer primary 38.

With respect to the physical placement of the various component parts just described, it is important that the transformer 40 and the ferrite antenna 10 be disposed in proximity to each other (see FIG. 2) closely enough to provide for inductive coupling therebetween. The precise spacing between the two components as well as the degree of coupling desired therebetween will vary in accordance with design preferences, the effect of such coupling being explained hereinafter.

In operation, the feedback-coupling capacitor 26 is so adjusted as to provide an amount of feedback just short of that required to cause the amplifier to oscillate. With this degree of regeneration, the circuit possesses maximum sensitivity over the higher frequency portion of the broadcast band. Similarly, the inductive coupling between the transformer 40 and the antenna 10 is in phase, or in other words, in a regenerative sense and is adjusted to provide maximum regeneration just short of causing the amplifier to oscillate. This adjustment is effected by moving the transformer and antenna closer together or farther apart as may be required. Also, the transformer 40 must be rotationally adjusted relative to the antenna 10 until the desired regenerative phase relationship is obtained.

In operation, the condenser 16 is tuned to a desired signal in the broadcast band. The winding 32 couples the signal of this tuned circuit 14, 16 to the base of the transistor 18, the winding 32 serving to match the impedance of the tuned circuit to the base of the transistor. The transistor functions as a regenerative amplifier and supplies the amplified radio frequency signal to the transformer 40. This signal is detected by the detector 44 and is in part converted to direct current by means of the filtering action of the condenser 48 and coupled back into the winding 32, hence to the base 20 of the transistor 18. The polarity of the detector 44 as well as the windings on the transformer 40 are such that the direct current produced by the combined action of the detector 44 and condenser 48 produces a unidirectional bias voltage which as applied to the base 20 reduces the gain of transistor 18 to provide automatic gain control. In other words, a stronger signal applied to the antenna 10 will produce a stronger signal on the primary of the transformer 40. The degenerative action just described provides a bias on the base 20 of such polarity that the gain of the transistor 18 is reduced thereby providing automatic gain control for the circuit.

Simultaneously with the development of this automatic gain control voltage, the audio frequency signal from the detector 44 is coupled to the base 20 of the transistor by the capacitor 52. The transistor 18 functions now as an ordinary audio amplifier and supplies this amplified audio signal to the head set 56. It is important to note that in order to obtain this audio amplification in the circui, it is necessary that the primary 38 of the transformer 40 present low reactance at audio frequencies.

As will now appear from the description of the operation thus far, the transistor 18 first functions as a regenerative amplifier and secondly as an audio amplifier, the gain thereof being automatically controlled.

Optimum regenerative characteristics over the entire broadcast band is achieved, as explained previously, by means of the feedback capacitor 26 and the inductive coupling between the transformer 40 and antenna 10. The combinative effect of these two coupling means conduces to maximum sensitivity in the receiver over the entire broadcast band without the necessity of a separate regeneration control which is tunable over the entire broadcast band. The receiver circuitry is thus simplified and reduced in cost, but perhaps of most importance is the fact that the size of the receiver is reduced while gaining superior performance characteristics.

Component parts values are given in the following for a specific embodiment of this invention by way of example only and are therefore not to be considered as limiting the scope of this invention.

| | |
|---|---|
| Coil 14 | 10 to 100 micromicrofarads. |
| Condenser 16 | 110 turns. |
| Transistor 18 | Type 2N169A. |
| Coil 32 | 5 to 10 turns. |
| Condenser 36 | .0015 microfarad. |
| Resistor 42 | 100,000 to 470,000 ohms. |
| Condenser 48 | .01 microfarad. |
| Resistor 50 | 10,000 to 27,000 ohms. |
| Condenser 52 | .05 microfarad. |
| Battery 54 | 4.5 volts. |

What is claimed is:

1. In combination, a tuned circuit, an amplifier having input and output circuits, said tuned circuit being operatively coupled to said input circuit regenerative feedback means intercoupled between said amplifier output circuit and said tuned circuit, a magnetic coupling device coupled to said output circuit, rectifying means coupled to said magnetic device for providing a unidirectional signal voltage, means for coupling said unidirectional signal voltage to said amplifier input circuit to provide automatic gain control; said magnetic device being positioned adjacent to said tuned circuit to thereby be inductively coupled to said tuned circuit in a polarity sense to provide regenerative feedback to said amplifier, and utilization means coupled to said output circuit.

2. In combination, a tuned circuit and an amplifier capacitively intercoupled in a regenerative amplifier circuit, said amplifier having input and output circuits, an output transformer coupled to said output circuit, a combination signal-detecting and rectifying circuit coupled to said transformer for providing a unidirectional voltage and an audio frequency signal, a network coupled to said combination circuit and to said input circuit for coupling said unidirectional voltage and said audio frequency signal to said amplifier, said unidirectional voltage serving to control automatically the gain of said amplifier, said amplifier amplifying said audio signal, and utilization means coupled to said transformer, said transformer being positioned in close proximity to said tuned circuit to thereby be inductively regeneratively coupled thereto.

3. In combination, a resonant circuit which includes a ferrite antenna, a transistor having base, emitter and collector elements, an inductor inductively coupled to said resonant circuit, said resonant circuit being coupled to said emitter element, said inductor being coupled to said base and emitter elements respectively, a coupling capacitor connected between said collector element and said resonant circuit for providing regenerative feedback in a first band of frequencies, a transformer having primary and secondary windings, the primary winding being operatively coupled between the collector and emitter elements, a rectifier and filtering circuit coupled to the secondary winding for providing a direct current signal, a coupling network composed of a capacitor and resistor in shunt coupled between said rectifier and filtering circuit and said base element thereby providing automatic gain control, said transformer being situated in close proximity to said ferrite antenna in inductive coupling relationship and phased to provide regenerative feedback in said resonant circuit in a second band of frequencies adjacent to said first band of frequencies.

4. In combination, a resonant circuit, a transistor having base, emitter and collector elements, an inductor coupled to said resonant circuit, said resonant circuit being coupled to said emitter element, said inductor being coupled to said base and emitter elements respectively, a coupling capacitor connected between said collector element and said resonant circuit for providing regenerative feedback in a first band of frequencies, a transformer having primary and secondary windings, the primary winding being operatively coupled between the collector and emitter elements, a rectifier coupled to the secondary winding for providing a direct current signal, means coupling said rectifier to said base element for providing automatic gain control, said transformer being situated adjacent said resonant circuit in inductive coupling relationship and phased to provide regenerative feedback in said resonant circuit in a second band of frequencies adjacent to said first band of frequencies.

5. A reflex circuit comprising a resonant circuit tuned to a given radio frequency, a transistor having base, emitter and collector elements, an inductor coupled to said resonant circuit, said resonant circuit inducing a radio frequency signal onto said inductor, said inductor being coupled across said base and emitter elements respectively for applying said signal thereto, a coupling capacitor connected between said collector element and said resonant circuit for producing regenerative feedback in the latter in a first band of frequencies, a transformer having primary and secondary windings, the primary winding being operatively coupled between the collector and emitter elements, an audio detector and filtering circuit coupled to the secondary winding for providing a detected audio signal and a unidirectional voltage, a coupling network composed of a capacitor and resistor connected in shunt coupled between said detector and filtering circuit and said base element whereby said detected audio signal is applied to and amplified by said transistor and said unidirectional voltage is applied to said base element for providing automatic gain control, said transformer being disposed adjacent said resonant circuit in inductive coupling relationship and phased to provide regenerative feedback in said resonant circuit in a second band of frequencies which is lower than but adjacent to said first band of frequencies, and means coupled to said collector and emitter for utilizing the audio signal as amplified by said transistor.

6. In combination, an amplifier having current-collecting, current-emitting and control elements, a signal input circuit coupled to said control element for applying a modulated input signal to said amplifier, said input circuit including an inductor, a signal output circuit coupled to said current-collecting and current-emitting elements for demodulating the signals amplified by said amplifier and for producing a unidirectional voltage, said signal output circuit including a transformer and rectifying device for developing the unidirectional voltage in response to said amplified signals, a capacitive feedback circuit regeneratively coupled between said current-collecting and control elements, said transformer positioned in close proximity to and being inductively regeneratively coupled to said inductor, and a circuit coupling said rectifying device to said control element for applying said unidirectional voltage to the latter in a polarity sense to provide automatic gain control, said capacitive and inductive coupling cooperating to enhance sensitivity in the higher and lower frequency spectra, respectively, of a given band of radio frequencies.

References Cited in the file of this patent

UNITED STATES PATENTS

| | | |
|---|---|---|
| 1,735,185 | Schaffer | Nov. 12, 1929 |
| 1,824,331 | Cummings, Jr. | Sept. 22, 1931 |
| 2,777,056 | Bull | Jan. 8, 1957 |
| 2,863,065 | De Witt | Dec. 2, 1958 |
| 2,916,616 | Boscia | Dec. 8, 1959 |

FOREIGN PATENTS

| | | |
|---|---|---|
| 331,191 | Great Britain | June 23, 1930 |
| 145,002 | Austria | Mar. 25, 1936 |
| 152,511 | Australia | Apr. 26, 1951 |